(12) United States Patent
Fiedler et al.

(10) Patent No.: US 7,489,073 B2
(45) Date of Patent: Feb. 10, 2009

(54) BLUE TO YELLOW-ORANGE EMITTING PHOSPHOR, AND LIGHT SOURCE HAVING SUCH A PHOSPHOR

(75) Inventors: Tim Fiedler, München (DE); Wolfram Hempel, Germering (DE); Frank Jermann, München (DE)

(73) Assignee: Patent-Treuhand-Gesellschaft für elektrische Glühlampen mbH, Munich (DE)

( * ) Notice: Subject to any disclaimer, the term of this patent is extended or adjusted under 35 U.S.C. 154(b) by 373 days.

(21) Appl. No.: 11/400,873

(22) Filed: Apr. 10, 2006

(65) Prior Publication Data
US 2006/0232193 A1    Oct. 19, 2006

(30) Foreign Application Priority Data
Apr. 15, 2005    (DE) .................. 10 2005 017 510

(51) Int. Cl.
*H01J 1/62*    (2006.01)
*H01J 63/04*    (2006.01)

(52) U.S. Cl. ............... 313/503; 313/498; 313/501; 257/103; 445/23

(58) Field of Classification Search ............ 313/503, 313/501, 498; 445/23–25; 257/103
See application file for complete search history.

(56) References Cited

U.S. PATENT DOCUMENTS

| | | | |
|---|---|---|---|
| 4,810,938 A | 3/1989 | Johnson et al. | |
| 5,998,925 A | 12/1999 | Shimizu et al. | |
| 2002/0195935 A1 | 12/2002 | Jäger et al. | |

FOREIGN PATENT DOCUMENTS

| | | |
|---|---|---|
| DE | 101 53 615 | 10/2001 |
| WO | WO 01/50540 A1 | 7/2001 |
| WO | WO 03/080763 A1 | 10/2003 |

*Primary Examiner*—Joseph L Williams
(74) *Attorney, Agent, or Firm*—Cohen Pontani Lieberman & Pavane LLP

(57) ABSTRACT

The phosphor having the composition $xAE_2SiO_4:D.yREN$, in which AE=(Sr, Ba, Ca, Mg) and D=Eu, and RE=La, Y, delivers a blue to yellow-orange emission and is distinguished by a high efficiency. It can be used for a very wide range of light sources.

14 Claims, 9 Drawing Sheets

BLUE TO YELLOW-ORANGE EMITTING PHOSPHOR, AND LIGHT SOURCE HAVING SUCH A PHOSPHOR

FIELD OF THE INVENTION

The invention is based on a blue to yellow emitting phosphor and also relates to a light source, in particular an LED, having a phosphor of this type. The phosphor belongs to the class of the orthosilicates.

BACKGROUND OF THE INVENTION

Hitherto, there has only been a small number of technically viable phosphors which can be excited in the UV and in particular in the blue spectral region and emit in the blue to orange-yellow (dominant wavelength 450 to 590 nm). In particular, stable green phosphors with an emission maximum from 525 to 530 nm are scarcely available. This makes it difficult to use luminescence conversion LEDs for display backlighting and restricts the optimization of LED with high color rendering or low luminous color, such as warm-white. Hitherto, primarily standard orthosilicates have been used as green phosphor for these applications in products of this type. However, they can only be moderately excited in particular in the blue. Although the emission can be optimized by mixing the cations Ba, Sr, Ca, one such example being SrCaSiO4:Eu, this mixture often leads to a deterioration in the quantum efficiency, in this case compared to pure Sr2SiO4:Eu.

An othosilicate of this type is known for example from WO 03/080763, which is (Ba, Sr, Ca)SiO4:Eu which emits in the green at approximately 530 nm. It is used together with further phosphors.

SUMMARY OF THE INVENTION

It is an object of the present invention to provide a phosphor which emits blue to yellow-orange and can be excited in particular in the emission range of typical UV and blue LEDs.

A further object is to provide a phosphor with a high efficiency.

A further object is to provide a light source, in particular an LED, having a phosphor of this type.

These and other objects are attained in accordance with one aspect of the present invention directed to a blue to yellow-orange emitting phosphor from the class of the orthosilicates, which substantially has the composition AE2SiO4:D, wherein the phosphor has as component AE=Sr, Ba, Ca or Mg, alone or in combination, the activating doping D consisting of Eu and a small proportion x of AEO contained therein being replaced by REN, where RE=rare earth, so as to achieve the stoichiometry $AE_{2-x-a}RE_xEu_aSiO_{4-x}N_x$.

Another aspect is directed to a light source having a primary radiation source, which emits radiation in the short-wave region of the optical spectral region in the wavelength range from 140 to 480 nm, this radiation being partially or completely converted into secondary radiation with a longer wavelength in the visible spectral region by means of a first phosphor such as the one described above.

The phosphors according to the invention can also be used in conjunction with other UV or blue light sources, such as molecular radiators (e.g. In discharge lamp), blue OLEDs or in combination with blue EL phosphors.

The phosphor according to the invention is a new type of nitrido-orthosilicate and allows the production of color-stable, efficient LEDs or LED modules based on a conversion LED. Further application areas are in LEDs with good color rendering, color-on-demand LEDs or white OLEDs.

The newly synthesized phosphor xAE2SiO4:Eu.yREN emits with a high efficiency, with the maximum lying in the blue to orange-yellow. In the case of excitation at 400 nm, the dominant wavelength is approximately 460 to 581 nm. The typical Eu doping is 3%. It can be shifted to an even longer wavelength by increasing the Eu content. Conversely, the emission shifts toward shorter wavelengths if the Eu content is low. In a stoichiometric representation, the new type of phosphor can be represented as $AE_{2-x-a}RE_xEu_aSiO_{4-x}N_x$, in which AE=at least one of the AE elements Sr, Ca, Ba, Mg. The abbreviation AE stands for alkaline-earth metal. RE stands for rare earths, in particular La and/or Y. In this context, a is preferably in the range from 0.02 to 0.45. Moreover, it is preferable for x to be in the range from 0.003 to 0.02.

The phosphor has good excitation properties in the range from 250-500 nm and in the extreme UV below 220 nm to beyond 140 nm.

The phosphor according to the invention is based on the possibility of a partial, charge-neutral replacement of the alkaline-earth metal oxides AEO where AE=(Sr, Ca, Ba, Mg) with rare earth nitrides REN, where in particular RE=(La, Y). This enables the color locus of the normal orthosilicates to be adapted to specific requirements without having an adverse effect on the quantum efficiency. Indeed, on the contrary in many compounds of this type, in particular with a moderate incorporation of LaN or YN, it is even possible to achieve higher quantum efficiencies. In particular, for a maximum quantum efficiency, the level of (RE)N:(AE)O should be approximately 0.005:0.995. A range from 0.003 to 0.013 has proven appropriate for REN, although in specific cases it is also possible to employ higher concentrations of up to 0.020 REN. The same also applies to the compounds which do not reveal a pronounced shift in color locus.

The fundamental structure of the phosphor is crucial to the excellent properties, without an accurate setting of the stoichiometry being important. The phosphor is very radiation-stable, allowing it to be used in high-brightness LEDs.

The AE ion Ba and/or Sr is preferably present in a molar amount of at least 66 mol %. The preferred AE ion, for example Sr, may be partially substituted by another AE ion, in this case therefore Mg and/or Ca, so that other wavelengths can also be reached. In particular, however, Sr and Ba are used as the AE ion, with at most small quantities of other AE ions, such as Ca and Mg, being introduced. It is preferable to use a maximum level of less than 5 mol % for Ca and less than 30 mol % for Mg.

Depending on the relative ratio of the sizes of the AE and RE ions involved, the lattice constant of the original orthosilicate host lattice increases or decreases. However, the basic structure is retained. On account of the lattice strain and the incorporation of $N^{3-}$ instead of $O^{2-}$ in the coordination sphere of the activator, preferably Eu alone, there is generally a red shift in the emission spectrum. It has been found that the effects are particularly great if the substitution can take place in a lattice with an orthorhombic structure. The crystallization of the orthosilicates in the orthorhombic structure can be achieved by means of a suitable cation composition and/or suitable annealing conditions, as is known per se.

In particular, this phosphor can be efficiently excited by a blue emitting LED, in particular of the type InGaN. It is also suitable for use with other light sources, and in particular for use together with other phosphors to generate white light with a very high Ra.

Efficient, in particular including warm-white, LEDs with a color rendering index Ra of up to 97 can be provided using a plurality of, in particular 3, phosphors, the typical quantum efficiency of which is well over 70%, and which absorb very well in the range of short-wave UV or blue radiation, in particular including at 450 to 455 nm, where the strongest chips are available. A typical Ra value is 88 to 95, depending on the desired optimization. In this case, in addition to the novel green-yellow phosphor, a red, in particular nitride, phosphor is added. By way of example, a nitrido-silicate, such as (Sr, Ca)2Si5N8:Eu or a sulfide is suitable as red-emitting component with peak emission at 600 to 650 nm, in particular 605 to 615 nm.

In detail, the invention also proposes an LED which is designed as a blue to yellow emitting luminescence conversion LED, with a primary radiation source which is a chip that emits in the blue or UV spectral region, and in front of it a layer of a phosphor which partially or completely converts the radiation of the chip, the phosphor originating from the class of the nitrido-orthosilicates described above, with a doping of europium.

A suitable light source is in particular an LED. The emission from the chip is preferably such that it has a peak wavelength in the range from 445 to 465 nm, in particular 450 to 455 nm. It is in this way possible to achieve the highest efficiencies of the primary radiation.

A further application area is a color emitting LED (color-on-demand), the emission of which is in the blue to yellow region of the spectrum.

Standard processes can be used for use in the LED. In particular, the following implementation options result.

Firstly, dispersing the phosphor in the LED potting compound, for example a silicone or epoxy resin, followed by application by, for example, casting, printing, spraying or the like. Secondly, the introduction of the phosphor into what is known as a molding compound, followed by transfer-molding. Thirdly, methods of near-chip conversion, i.e. application of the phosphors or their mixture at the wafer processing level, after the chips have been singulated and after mounting in the LED housing. In this context, reference is made in particular to DE 101 53 615 and WO 01/50540.

Light sources of this type are in particular UV or blue emitting LEDs of type InGaN or InGaAlP, or alternatively discharge lamps which use phosphors, as known per se, in particular high-pressure discharge lamps, which have a high color rendering index Ra, or which are based on indium lamps, which can be operated either at high pressure or low pressure. On account of its radiation stability, however, the novel phosphor is also suitable for discharge lamps, in particular for indium discharge lamps, and in particular as a stable phosphor for discharge lamps with a high Ra, for example over Ra=90. By way of example, the narrow-band emission of an orthosilicate containing predominantly Ba is suitable for LEDs which emit in the green and can be used for LCD applications.

DETAILED DESCRIPTION OF THE DRAWINGS

Figure 1:
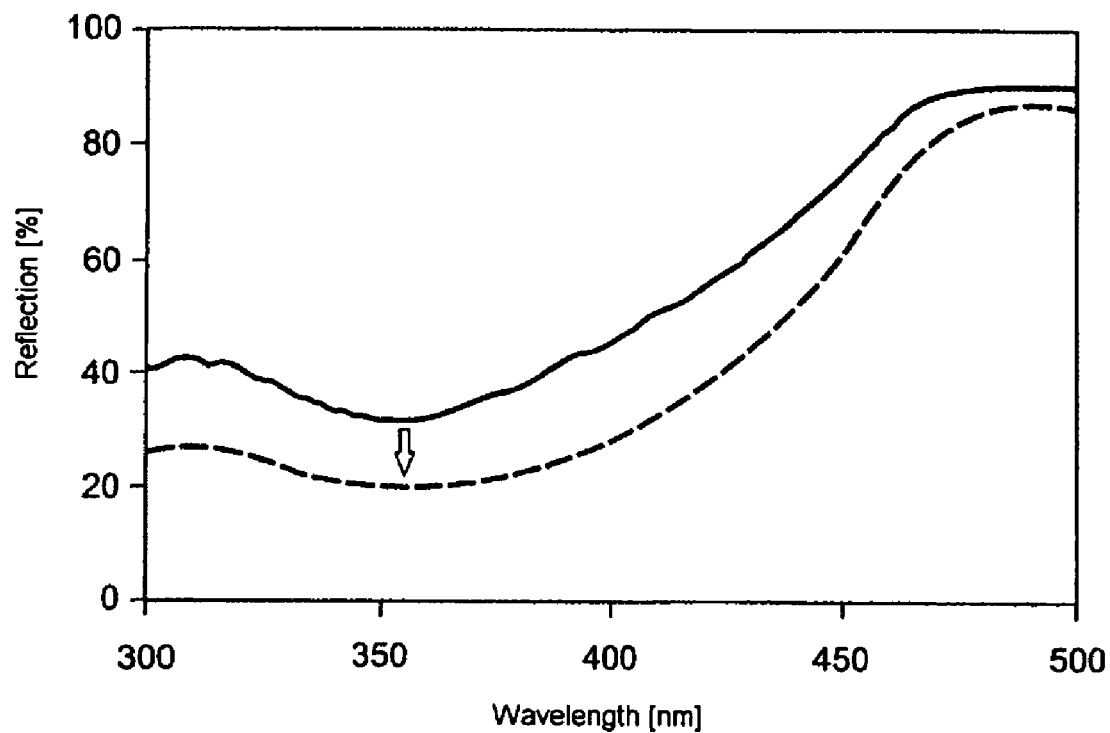
FIG. 1 shows the reflection of a phosphor according to the invention.

One specific example of the phosphor according to the invention is shown in FIG. 1, which shows the improvement in the absorption of the phosphor Ba2SiO4:Eu with an Eu content of 3 mol % at the lattice sites occupied by Ba as a function of the wavelength. Some of the BaO, namely 0.5 mol %, has been substituted by LaN. A general improvement in the absorption in the UV (shown beyond 300 nm) and in the blue, around 450 nm, is revealed.

Figure 2:
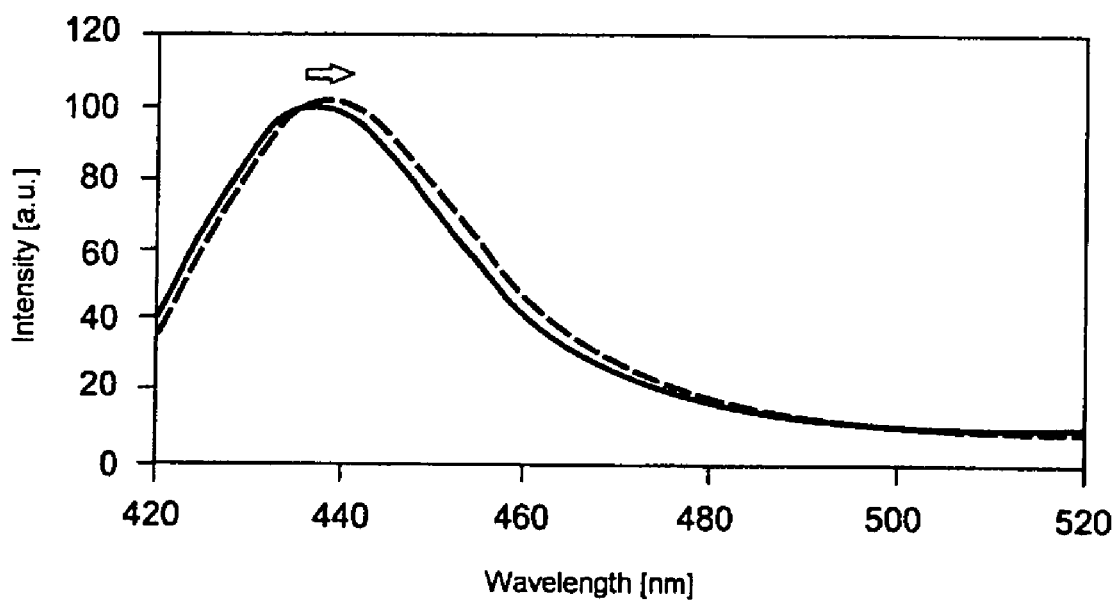
FIG. 2 shows the emission of a phosphor according to the invention.

FIG. 2 shows the effect of an LaN substitution on the emission of an orthosilicate of type Ba1.5Mg0.5SiO4:Eu. It reveals a slight red shift. The focal point of the emission in the blue thereby achieves a higher useful visual effect.

Figure 3:
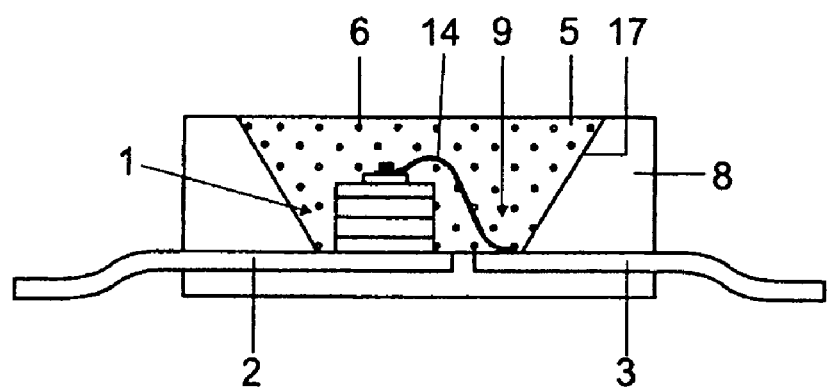
FIG. 3 shows the structure of a conversion LED.

The structure of a light source for green light is specifically shown in FIG. 3, similar to that described in U.S. Pat. No. 5,998,925. The light source is a semiconductor component with a chip 1 of type InGaN with a peak emission wavelength from 440 to 470 nm, for example 460 nm, which is embedded in an opaque base housing 8 in the region of a recess 9. The chip 1 is connected via a bonding wire 14 to a first terminal 3 and directly to a second electrical terminal 2. The recess 9 is filled with a potting compound 5, which as its main constituents contains an epoxy casting resin (80 to 90% by weight) and phosphor pigments 6 of a phosphor (less than 20% by weight). The phosphor is the xBa2SiO4.yLaN with 3% Eu presented as the first exemplary embodiment. The recess 9 has a wall 17 which serves as reflector for the primary and secondary radiation from the chip 1 and the pigments 6.

Moreover, the efficiency and color rendering index Ra are generally also adapted by the level of doping with Eu; an Eu level of from 2 to 4 mol % of the AE is preferred.

In the case of a white LED with three phosphors, in addition to green emitting phosphor xBa2SiO4.yLaN with 3% Eu, in this case in particular the nitrido-silicate $M_aSi_yN_z$:Eu, which as component M has Ca and/or Sr, is used as red emitting phosphor. In other words, the nitrido-silicate is characterized, for example, by formula $(Sr_xCa_{1-x})_2Si_5N_8$, where in particular x=0 to 0.1 or x=0.3 to 0.7. The combination of the blue primary radiation and red, yellow-green secondary radiation mixes to warm-white with a high Ra.

Figure 4:
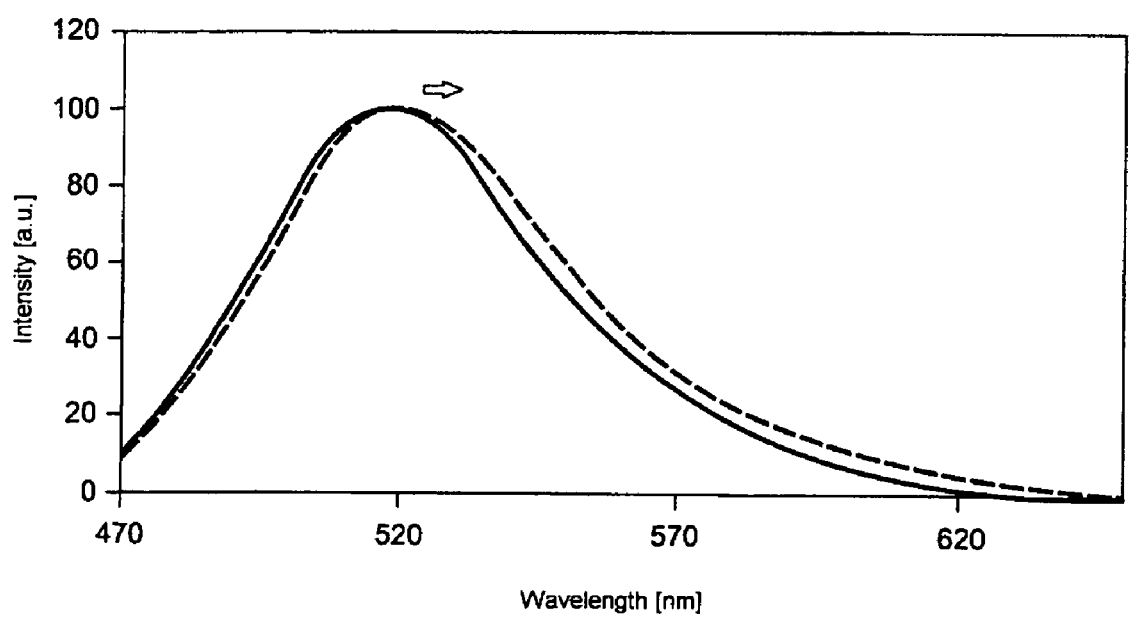
FIGS. 4-6 show the emission of in each case a further phosphor according to the invention.

The emission spectrum of a typical phosphor BaSrSiO4:Eu is shown in FIG. 4. This figure shows the effect of an LaN substitution on the emission. A slight red shift is achieved, resulting in a green with a longer wavelength and increased efficiency, which is more suitable for white mixtures.

Figure 5:
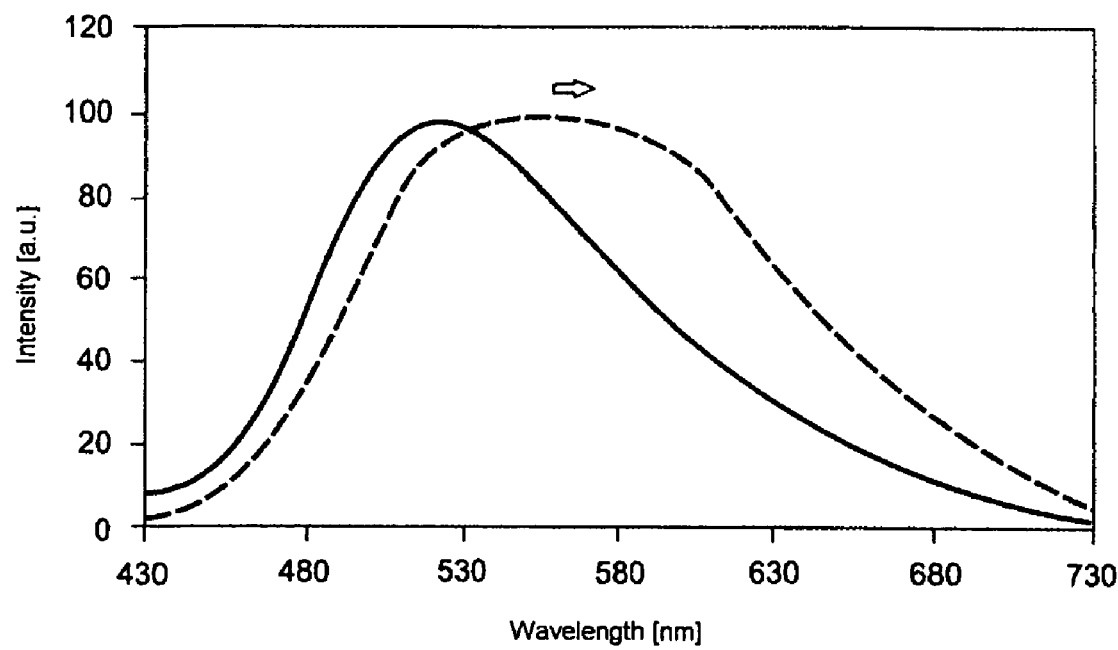

FIG. 5 shows the emission of the mixed silicate SrCaSiO4:Eu under the influence of a partial LaN substitution. A pronounced red shift is revealed.

Figure 6:
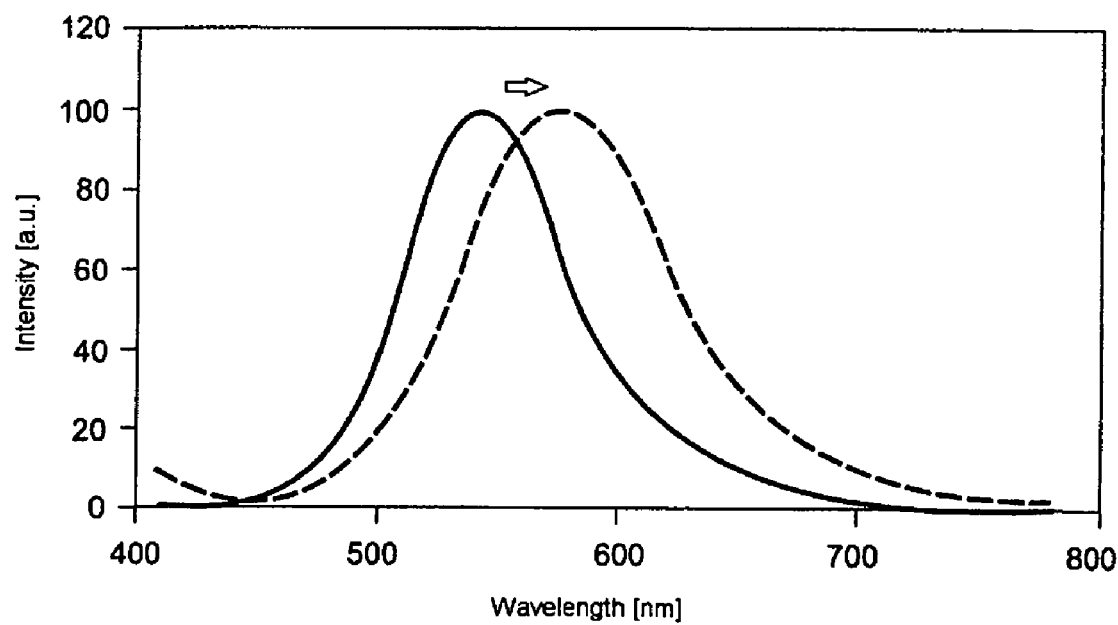

FIG. 6 shows the emission of the orthosilicate Sr2SiO4:Eu under the influence of a partial YN substitution. Once again, a pronounced red shift is revealed.

Figure 7A:
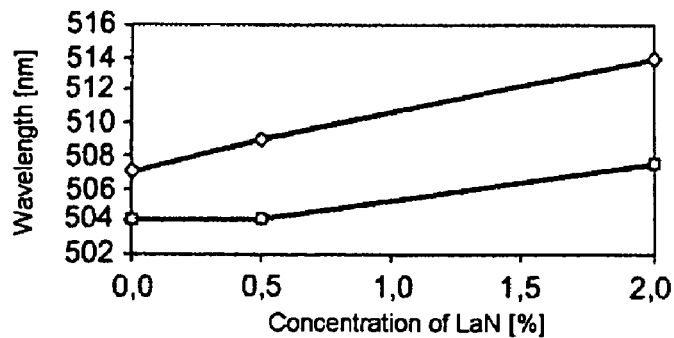
FIGS. 7-12 show the relative quantum efficiency and relative brightness of various phosphors.
Figure 7B:
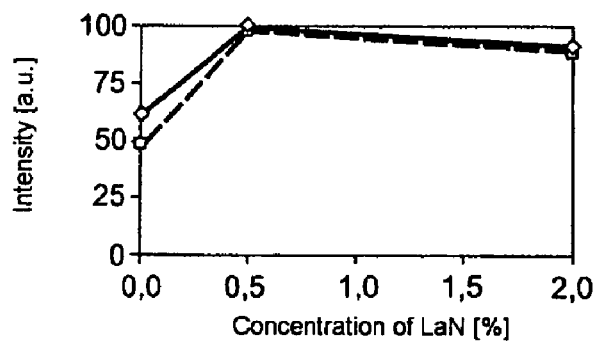

Finally, FIGS. 7a and 7b show, for the orthosilicate Ba2SiO4:Eu, the influence of increasing levels of LaN (in mol %) on the peak wavelength in nm (FIG. 7a) and the quantum efficiency and the relative brightness (FIG. 7b), in each case standardized to the maximum value. The sensitivity to small quantities of LaN is amazing. A maximum efficiency is achieved at approximately 0.5 mol % LaN (for BaO). The shift in the wavelength is approximately linear and also affects the emission distribution, as can be seen from the different curve for the dominant wavelength and the peak wavelength.

Figure 8A:
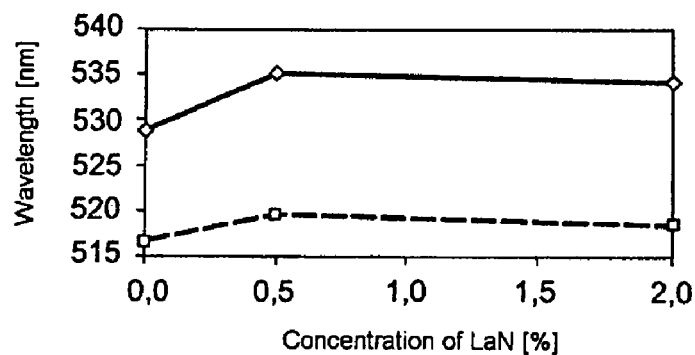
Figure 8B:
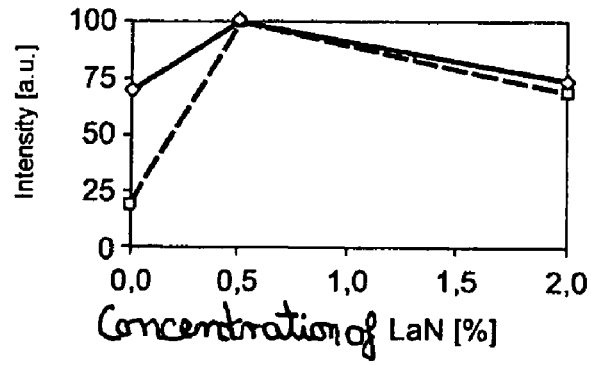

FIGS. 8a and 8b show the same parameters as FIG. 7 in the case of a mixed silicate BaSrSiO4:Eu. The shift in the wavelength is slightly less pronounced and is not linear, whereas the sensitivity of the quantum efficiency and the relative brightness is more pronounced. Once again, a maximum value is shown with a relatively small admixture of approximately 0.5 mol % LaN.

Figure 9A:
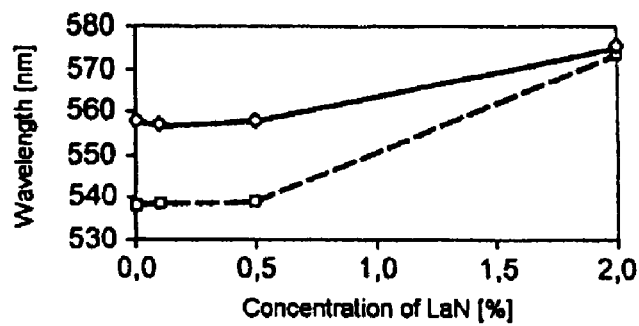
Figure 9B:
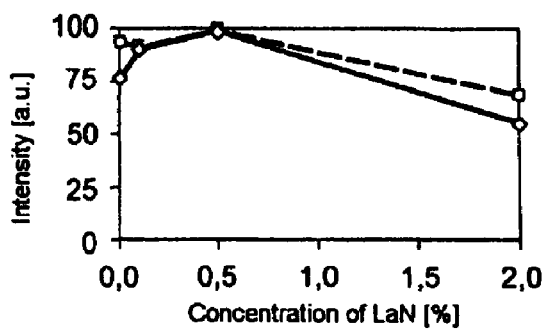

FIGS. 9a and 9b show the same parameters as FIG. 7 in the case of an orthosilicate SrSiO4:Eu. Here, the properties, amazingly, are quite different. The shift in the wavelength only occurs at a relatively high LaN concentration and then increases further.

Figure 10A:
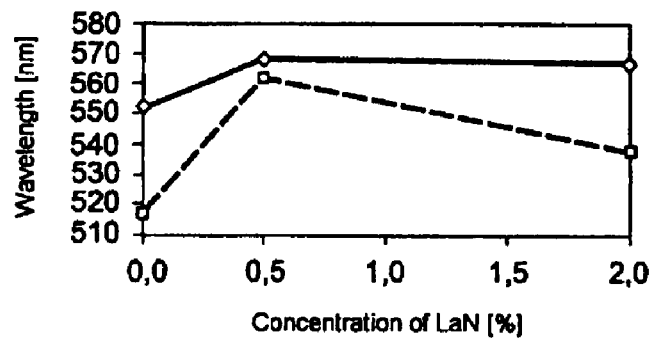
Figure 10B:
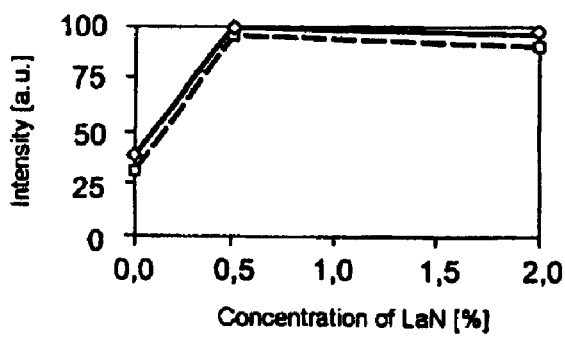

FIGS. 10a and 10b show the same parameters as FIG. 7 in the case of a mixed silicate CaSrSiO4:Eu. Here, the behavior is different again. The shift in the wavelength is relatively minor and nonlinear, whereas the sensitivity of the quantum efficiency and relative brightness is more pronounced. Here, there is virtually no dependency on the concentration anymore as soon as a minimum admixture level of 0.5 mol % LaN has been exceeded. However, the effect of the admixture is once again very pronounced.

Figure 11A:
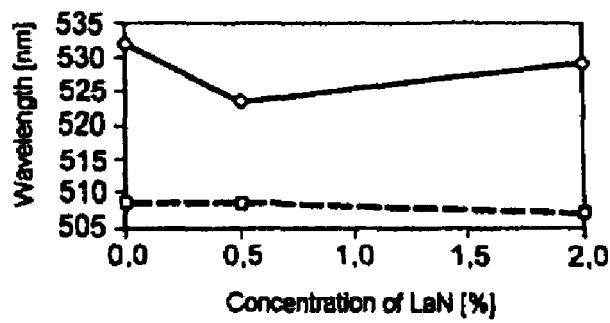
Figure 11B:
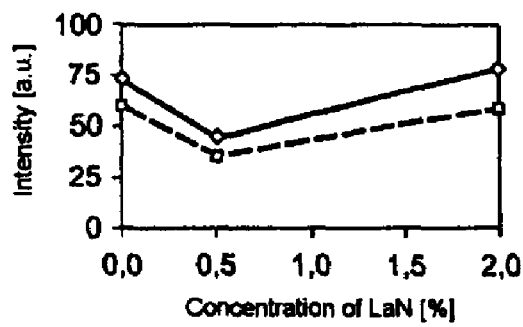

Yet another pattern is revealed for pure Ca orthosilicate Ca2SiO4:Eu in accordance with FIGS. 11a and 11b. In this case, the addition of LaN can only achieve a shift in the wavelength, but in this case toward shorter wavelengths, whereas a positive effect on the quantum efficiency and the luminous flux is not observed.

Figure 12A:
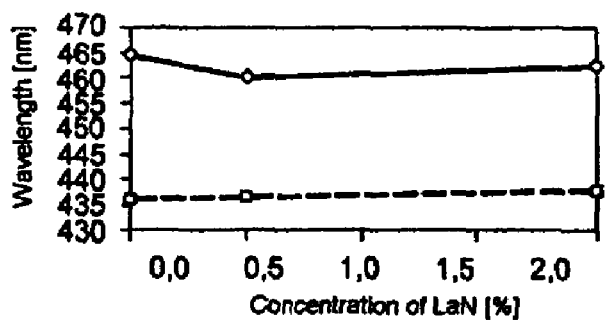
Figure 12B:
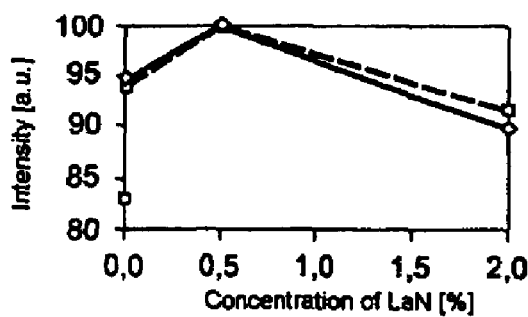

Very similar statements are true for the mixed silicate Ba1.5Mg0.5SiO4:Eu, the characteristics of which are shown in FIGS. 12a and 12b.

Overall, the test reveals that the behavior of the phosphor is highly dependent on the relative size of the cations. The addition of REN is an extraordinarily effective way of adapting the desired properties of a phosphor.

Figure 13:
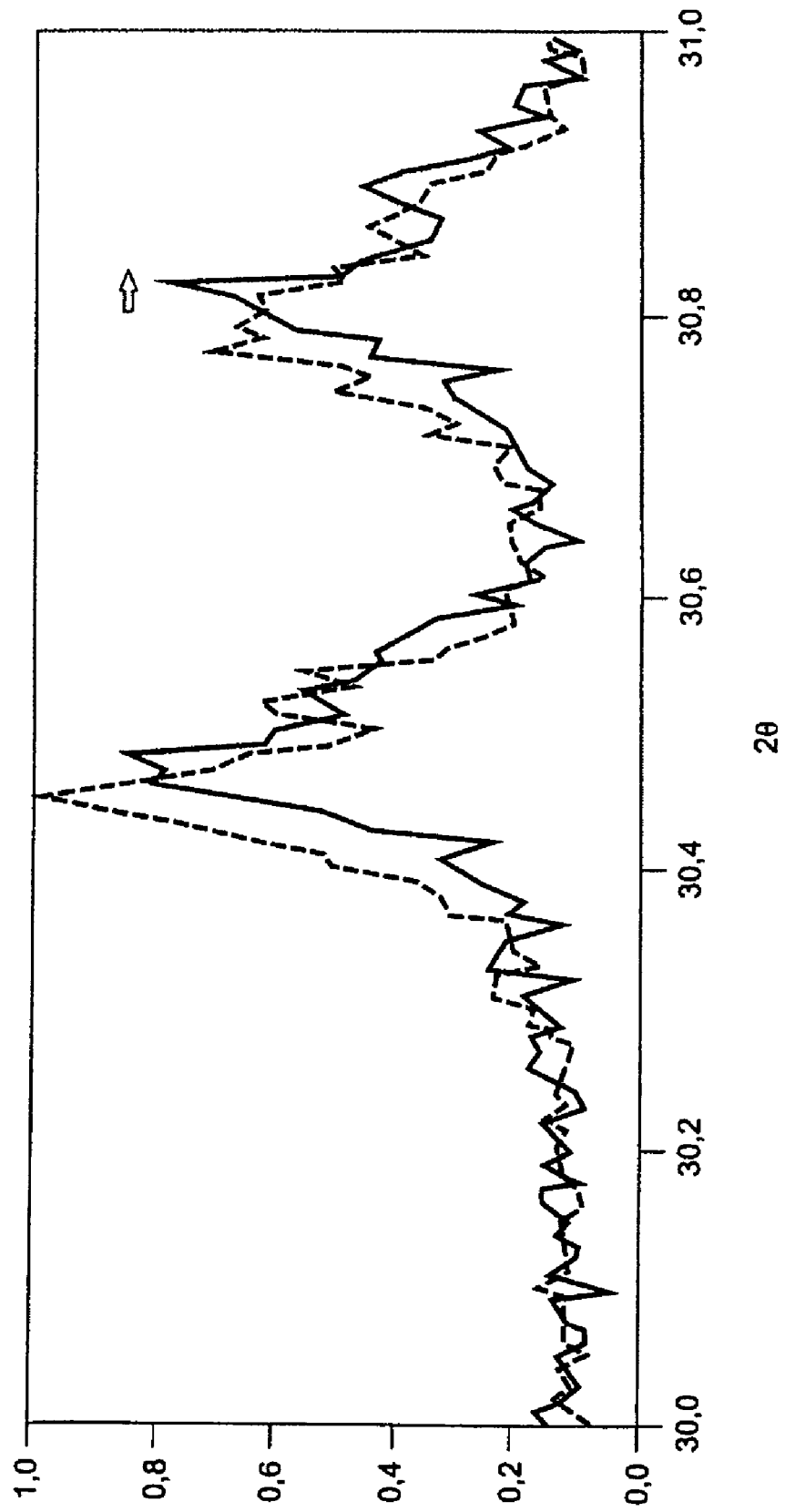
FIGS. 13-14 show the shift in the XRD lines caused by the incorporation of REN for two phosphors.

FIG. 13 shows the shift in the XRD reflections as a result of the incorporation of LaN, based on an original orthosilicate Ba2SiO4. This documents the strain in the host lattice, which ultimately brings about the properties documented above. On account of the reduced lattice constant, the incorporation of LaN here effects a red shift in the emission.

Figure 14:
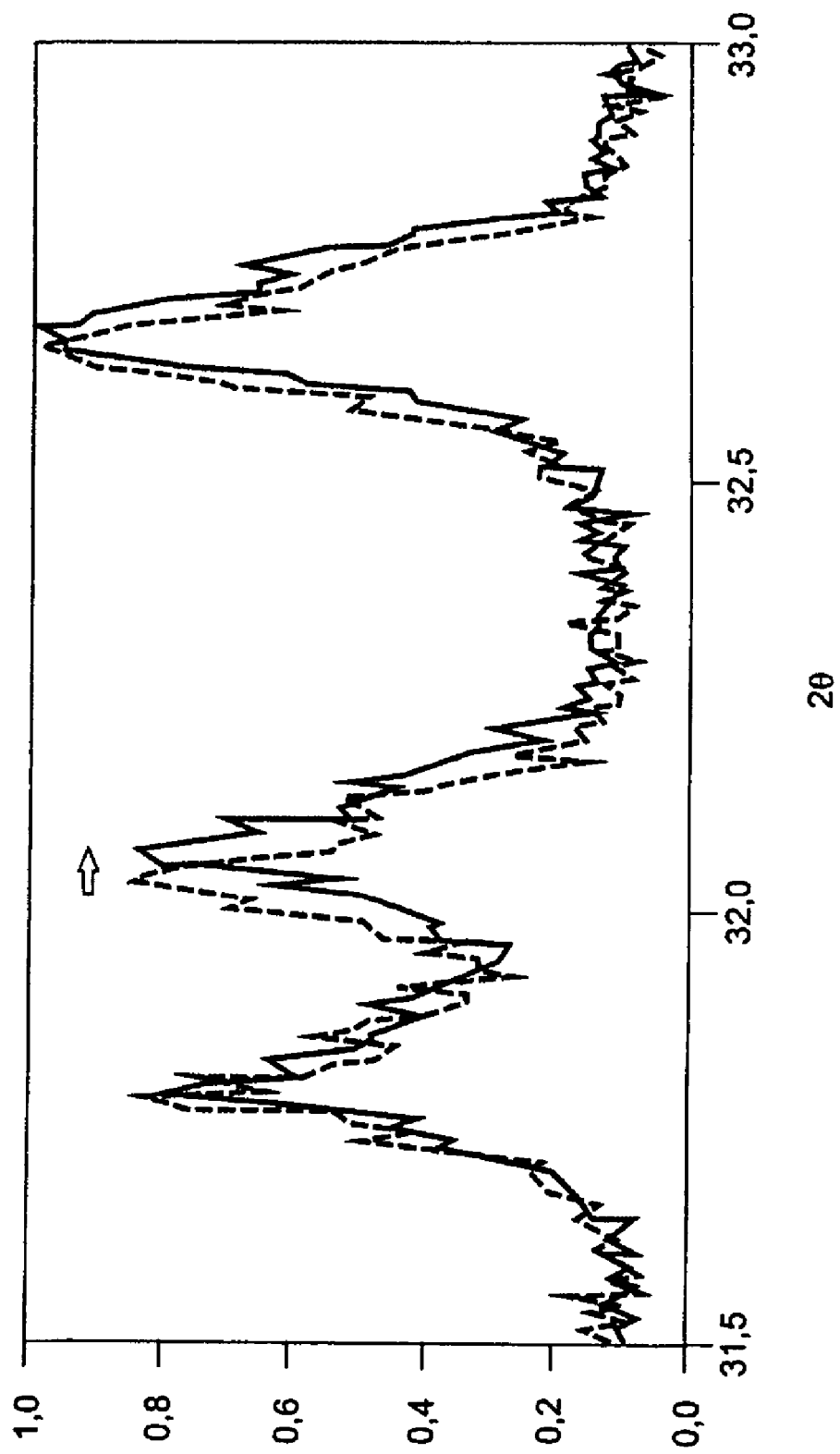

As shown in FIG. 14, the situation is similar for the mixed silicate SrCaSiO4:Eu. The incorporation of LaN effects a compression of the lattice. On account of the reduced lattice constant, the result is a strong red shift and broadening of the emission.

Figure 15:
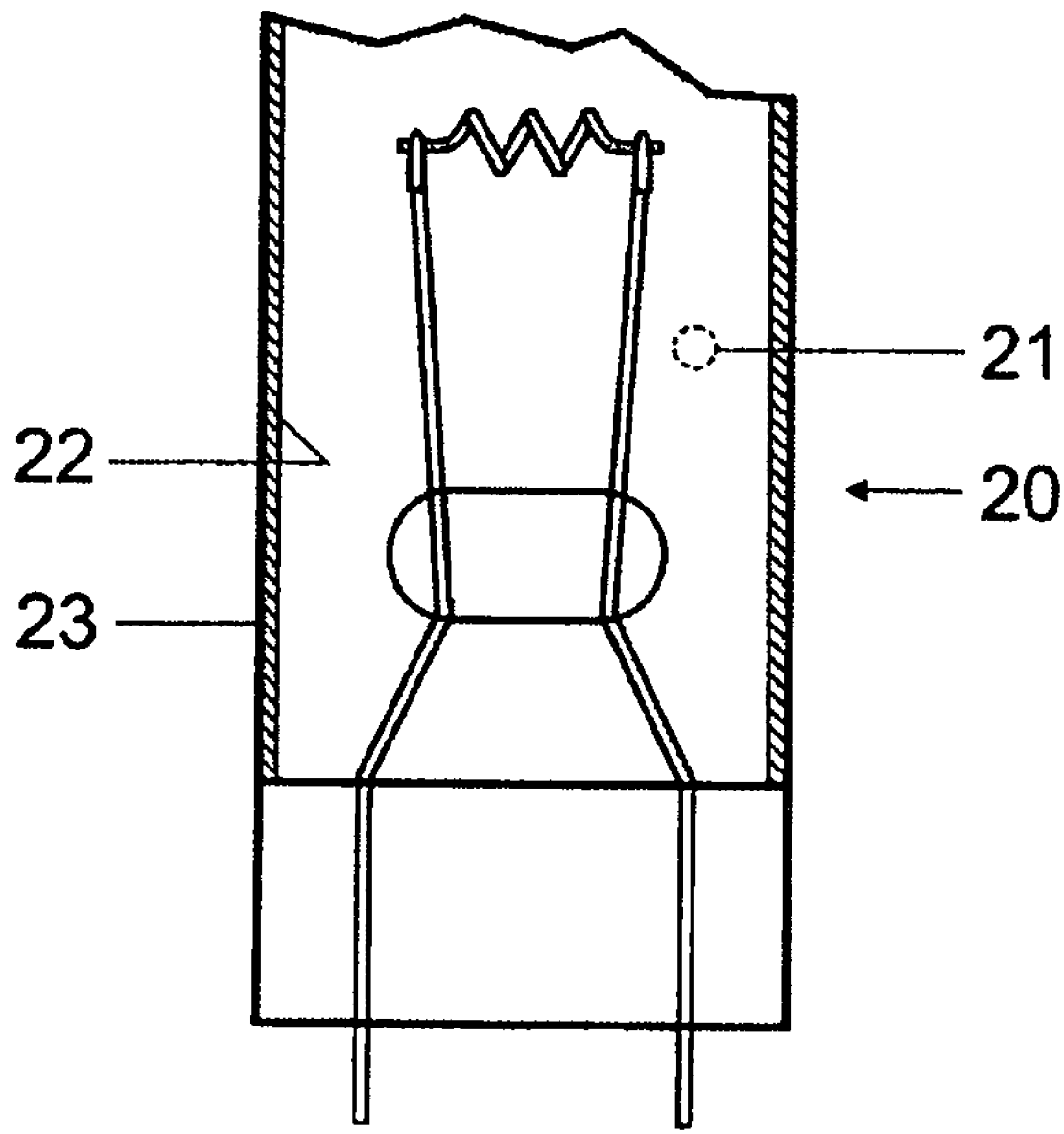
FIG. 15 shows a low-pressure lamp with indium fill using an orthosilicate.

FIG. 15 shows a low-pressure discharge lamp 20 with a mercury-free gas fill 21 (diagrammatically illustrated), which contains an indium compound and a buffer gas similar to WO 02/103748, with a layer 22 of orthosilicate xSr$_2$SiO$_4$:Eu.y-LaN applied to the inside of the bulb 23. The very particular advantage of this arrangement is that this orthosilicate is ideally matched to the indium radiation, since the latter has significant components both in the UV and in the blue spectral region, which are both equally well absorbed by this orthosilicate, which makes it superior for this use to the phosphors which have been disclosed hitherto. These known phosphors significantly absorb either only the UV radiation or the blue radiation of the indium, which means that the indium lamp according to the invention has a considerably higher efficiency. This statement also applies to an indium lamp based on high pressure as is known per se from U.S. Pat. No. 4,810,938.

The process for producing a high-efficiency phosphor of this type uses the following process steps:

a) providing the starting materials SiO$_2$ and REN, AE precursors, in particular at least one of SrCO$_3$, BaCO$_3$, CaCO$_3$ and MgO, and an Eu precursor, in particular Eu$_2$O$_3$, in a substantially stoichiometric ratio;

b) mixing the starting materials and annealing in an Al$_2$O$_3$, AlN or W or Mo crucible using a flux, in particular SrF$_2$ or BaF$_2$;

c) the annealing of the mixture being carried out at approximately 1300 to 1700° C., preferably 1500 to 1600° C.

We claim:

1. A blue to yellow-orange emitting phosphor from the class of the orthosilicates, which substantially has the composition AE2SiO4:D, wherein the phosphor has as component AE=Sr, Ba, Ca, or Mg, alone or in combination, the activating doping D consisting of Eu and a small proportion x of AEO contained therein being replaced by REN, where RE=rare earth, so as to achieve the stoichiometry $AE_{2-x-a}RE_xEu_aSiO_{4-x}N_x$.

2. The phosphor as claimed in claim 1, wherein RE=La or Y alone or in combination.

3. The phosphor as claimed in claim 1, wherein the Eu content is between a =0.02 and 0.45.

4. The phosphor as claimed in claim 1, wherein AE contains Sr and/or Ba to an amount of at least 66 mol %, in particular with a Ca content of at most 5 mol % and an Mg content of at most 30 mol %.

5. The phosphor as claimed in claim 1, wherein the content x is between 0.3 and 2 mol %.

6. A light source having a primary radiation source, which emits radiation in the short-wave region of the optical spectral region in the wavelength range from 140 to 480 nm, this radiation being partially or completely converted into secondary radiation with a longer wavelength in the visible spectral region by means of a first phosphor as claimed in claim 1.

7. The light source as claimed in claim 6, wherein the primary radiation source used is a light-emitting diode based on InGaN or InGaAlP or a discharge lamp based on low pressure or high pressure, or an electroluminescent lamp.

8. The light source as claimed in claim 6, wherein part of the primary radiation is also converted into radiation with a longer wavelength by means of further phosphors, the phosphors in particular being selected and mixed appropriately so as to generate white light.

9. The light source as claimed in claim 7, wherein the light-emitting diode includes an indium-containing fill.

10. A process for producing a high-efficiency phosphor, comprising the steps of:

a) providing the starting materials SiO$_2$ and REN, AE precursors, and an Eu precursor, in a substantially stoichiometric ratio;

b) mixing the staring materials to form a mixture; and c) annealing the mixture in an Al$_2$O$_3$, AlN or W or Mo crucible using a flux at approximately 1300 to 1700° C.

11. The process as claimed in claim 10, wherein the AE precursors comprise at least one of SrCO$_3$, BaCO$_3$, CaCO$_3$ and MgO.

12. The process as claimed in claim 10, wherein the Eu precursor is Eu$_2$O$_3$.

13. The process as claimed in claim 10, wherein the flux is SrF$_2$ or BaF$_2$.

14. The process as claimed in claim 10, wherein the annealing is carried out at 1500-1600° C.

* * * * *